(12) United States Patent
Kim et al.

(10) Patent No.: US 6,429,445 B1
(45) Date of Patent: Aug. 6, 2002

(54) ELECTRON BEAM IRRADIATING APPARATUS HAVING CATHODE PLATE FORMED OF NON-METAL CONDUCTIVE MATERIAL

(75) Inventors: Seong-ho Kim; Sung-jin Kim, both of Yongin; Hae-jeong Lee, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/639,833

(22) Filed: Aug. 16, 2000

(30) Foreign Application Priority Data

Aug. 16, 1999 (KR) .............................. 99-33650

(51) Int. Cl.⁷ .............................. G21G 5/00; A61N 5/00; C23C 14/00
(52) U.S. Cl. ................. 250/492.3; 250/492.2; 250/423 F; 204/192.12
(58) Field of Search .................... 250/423 F, 423 R, 250/492.3, 492.2; 219/121.43; 204/192.12

(56) References Cited

U.S. PATENT DOCUMENTS

| | | | |
|---|---|---|---|
| 3,924,153 A | 12/1975 | McIntyre | 315/14 |
| 5,003,178 A | * 3/1991 | Livesay | 250/423 F |
| 5,417,827 A | 5/1995 | Finley | 204/192.28 |
| 5,843,537 A | * 12/1998 | Kim et al. | 427/131 |
| 6,030,511 A | * 2/2000 | Shinmura | 204/192.12 |
| 6,087,615 A | * 7/2000 | Schork et al. | 219/121.43 |

* cited by examiner

Primary Examiner—Jack Berman
Assistant Examiner—Kalimah Fernandez
(74) Attorney, Agent, or Firm—Mills & Onello LLP

(57) ABSTRACT

An electron beam irradiating apparatus adopting a cathode plate including a non-metal conductive material. The electron beam irradiating apparatus includes a chamber having an opening at the top thereof, a cathode plate disposed to cover the opening of the chamber, a susceptor disposed on the inner bottom surface of the chamber, a grid plate disposed between the cathode plate and the susceptor, and a gas injection ring disposed below the grid plate. The cathode plate and the chamber are electrically insulated from each other, and the grid plate is electrically insulated from the chamber and the cathode plate. The cathode plate may be a single plate formed of the non-metal conductive material alone or a double cathode plate in which at least a lower surface thereof, facing the bottom surface of the chamber, is formed of a non-metal conductive material. When electrons are emitted from the cathode plate by applying a predetermined voltage to the cathode and grid plates, simultaneous emission of metal atoms from the cathode plate can be eliminated.

12 Claims, 4 Drawing Sheets

ELECTRON BEAM IRRADIATING APPARATUS HAVING CATHODE PLATE FORMED OF NON-METAL CONDUCTIVE MATERIAL

BACKGROUND OF THE INVENTION

1. Field of the Invention

The present invention relates to an electron beam irradiating apparatus for use in semiconductor device fabrication, and more particularly, to an electron beam irradiating apparatus having a cathode plate formed of a non-metal conductive material.

2. Description of the Related Art

Semiconductor devices are comprised of conductive layers used to form interconnections and insulation layers for electrically insulating neighboring interconnections. With increases in the operating speed of highly integrated semiconductor devices, the need for a multi-layered interconnection techniques has increased. This has increased the interest in planarization technologies for inter-layer dielectric (ILD) films and inter-metal dielectric (IMD) films. At present, a technique for reflowing an oxide layer, which contains impurities such as boron and/or phosphorous, for example, a borophosphosilicate glass (BPSG) layer, at a high temperature of 850° C. or more, has been adopted to planarize ILD films. Also, for IMD film planarization, a spin-on-glass (SOG) technique has been used. Under this technique, a liquid spin-on-glass is spun on a semiconductor substrate on which a lower metal interconnection has been formed. Then the glass is cured at a low temperature of 500° C. or less. In the curing of the SOG layer, a UV irradiation or electron beam irradiation technique has been widely used.

In the electron beam irradiation approach, the energy of the electron beams can readily be controlled, compared to UV irradiation. Also, the electron beam irradiation can be applied in baking a photoresist layer as well as in the curing of the SOG layer. Systems used in electron beam irradiation are very similar to sputtering systems.

A conventional electron beam irradiating apparatus includees a cathode plate on the top of an airtight chamber and a susceptor, on which a wafer will be mounted, disposed on the bottom of the chamber, facing the cathode plate. The cathode plate is formed of a conductive metal material, for example, aluminum (Al) or an aluminum alloy. Also, a grid plate, i.e., an anode plate, through which electron beams emitted from the cathode plate can pass, is disposed between the cathode plate and the susceptor. Also, a gas injecting ring for supplying a process gas such as an inert gas into the chamber is provided.

In the operation of the conventional electron beam apparatus, the pressure of the chamber is maintained at a low pressure which is lower than atmospheric pressure, and a process gas is allowed to flow into the chamber through the gas injecting ring. A high negative voltage, for example, a voltage of −500 to −3,000 volts, is applied to the cathode plate, while a low negative voltage, for example, a voltage of 0 to −100 volts, is applied to the grid plate. At this time, the process gas is slightly ionized due to the low pressure in the chamber and gamma rays which spontaneously generate in the chamber, and the positive process gas ions move to the grid plate due to the low negative voltage applied to the grid plate. The positive ions pass through holes of the grid plate and are accelerated toward the cathode plate to which the high negative voltage is applied. As the accelerated positive ions hit the surface of the cathode plate, secondary electrons are emitted from the cathode plate. At this time, metal atoms such as aluminum (Al) atoms which form the cathode plate, as well as the electrons, may be emitted. The electrons emitted from the cathode plate reach the ionized process gas through the grid plate. Some electrons further ionize the process gas into positive and negative ions, and the remaining electrons reach the surface of the wafer loaded onto the susceptor. Also, the metal atoms emitted from the cathode plate, i.e., Al atoms, reach the wafer surface.

As described above, the conventional electron beam irradiating apparatus generates metal atoms as well as electrons, so that the wafer surface is subjected to contamination by the metal atoms. In particular, when a photoresist layer is baked or a SOG layer is cured using the conventional electron beam irradiating apparatus, prior to metal interconnection formation, the electrical properties of MOS transistors can vary. For example, the characteristics of the junction leakage current of sources/drains are deteriorated or the threshold voltage characteristics can change. In the case where the wafer surface is contaminated by metals the electrical properties and the reliability of MOS transistors are sharply deteriorated. Also, in the case where the wafers contaminated by the metal atoms are immersed in a bath containing a rinsing solution, the rinsing bath may be also contaminated by the metal atoms. Thus, succeeding wafers which are immersed in the contaminated bath are exposed to contamination left behind by preceding wafers, which cumulatively increases.

SUMMARY OF THE INVENTION

It is an object of the present invention to provide an electron beam irradiating apparatus capable of preventing the surface of wafers from becoming contaminated by metal atoms.

To achieve the object, the present invention provides an electron beam irradiating apparatus which includes a chamber having an opening at its top side. A cathode plate is disposed to cover the opening of the chamber and has a bottom surface which faces the bottom of the chamber and is formed of a non-metal conductive material. A susceptor is disposed on the inner bottom surface of the chamber. A grid plate is disposed between the cathode plate and the susceptor.

In one embodiment, a gas injection ring is included to allow a process gas to enter the chamber. In one particular embodiment, the gas injection ring is disposed between the grid plate and the susceptor.

In one embodiment, the cathode plate and the chamber are electrically insulated from each other. Also, the grid plate can be electrically insulated from the chamber and the cathode plate.

In one embodiment, the cathode plate is a single cathode plate formed of the non-metal conductive material alone. The non-metal conductive material can be silicon. In another embodiment, the cathode plate is a double cathode plate in which at least a lower surface of the cathode plate, facing the bottom surface of the chamber, is made of the non-metal conductive material. Specifically, the double cathode plate can have an upper cathode plate made of metal such as aluminum (Al) or an Al alloy and a lower cathode plate made of the non-metal conductive material such as silicon.

In one embodiment, the chamber is connected to ground terminal, so that the susceptor and a wafer loaded on the susceptor are grounded. The chamber can be connected to a vacuum pump. The vacuum pump functions to control the inner pressure of the chamber at a lower pressure than the atmospheric pressure.

In accordance with the invention, a wafer is loaded onto the susceptor, and the inner pressure of the chamber is maintained at a lower pressure than the atmospheric pressure by operation of the vacuum pump. A process gas is flowed into the chamber through the gas injection ring. A high negative voltage of −500 to −30,000 volts is applied to the cathode plate, while a low negative voltage of 0 to −500 volts is applied to the grid plate. At this time, the process gas injected into the chamber is slightly ionized by gamma rays, which spontaneously generate in the chamber, thus producing positive and negative ions. The produced positive ions, due to the electric field created by the voltages applied to the grid and cathode plates, pass through the grid plate and are accelerated toward the cathode plate. Finally the accelerated positive ions hit the cathode plate, thus inducing emission of secondary electrons from the surface of the cathode plate. Since the bottom surface of the cathode plate, which is struck by the positive ions, is formed of a non-metal conductive material, for example, silicon, emission of metal atoms does not occur with the emission of the secondary electrons from the cathode plate surface. The electrons emitted from the cathode plate reach the wafer surface with a predetermined energy, according to the electric field produced by the voltages applied to the grid and cathode plates. Accordingly, a predetermined material layer formed on the wafer surface, for example, a spin-on-glass (SOG) layer, is cured, resulting in a material layer which has similar properties to those of silicon oxide layers.

The electron beam irradiating apparatus according to the present invention uses a cathode plate whose bottom surface is made of a non-metal material, so that emission of the metal atoms from the cathode plate can be eliminated. Thus, the contamination of the wafer surface by metal atoms during electron beam irradiation can be avoided.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
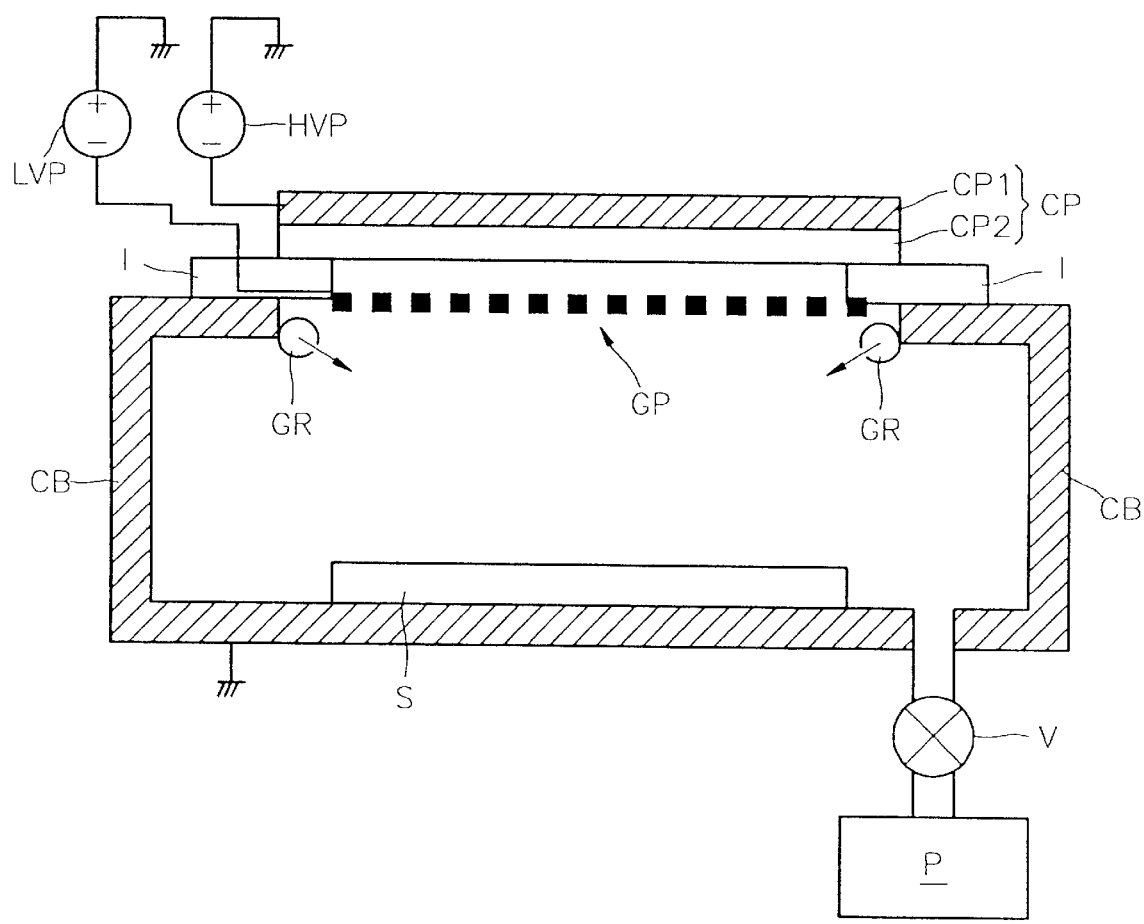
FIG. 1 is a schematic sectional view illustrating one embodiment of an electron beam irradiating apparatus according to the present invention.

Referring to FIG. 1 is a schematic sectional view of one embodiment of an electron beam irradiating apparatus according to the present invention. The apparatus of the invention includes a chamber Cbin which a predetermined process takes place. The chamber CB has an opening at its top surface. A cathode plate CP, which in one embodiment is electrically insulated from the chamber CB, is installed over the opening. An insulating ring I is interposed between the cathode plate CP and the top of the chamber CB. The cathode plate CP may be a single cathode plate formed of a non-metal conductive material such as silicon, or a dual cathode plate having an upper cathode plate CP1 formed of a metal such as aluminum (Al) or an Al alloy, and a lower cathode plate CP2 formed of a non-metal conductive material such as silicon. The chamber CB is grounded.

Figure 2:
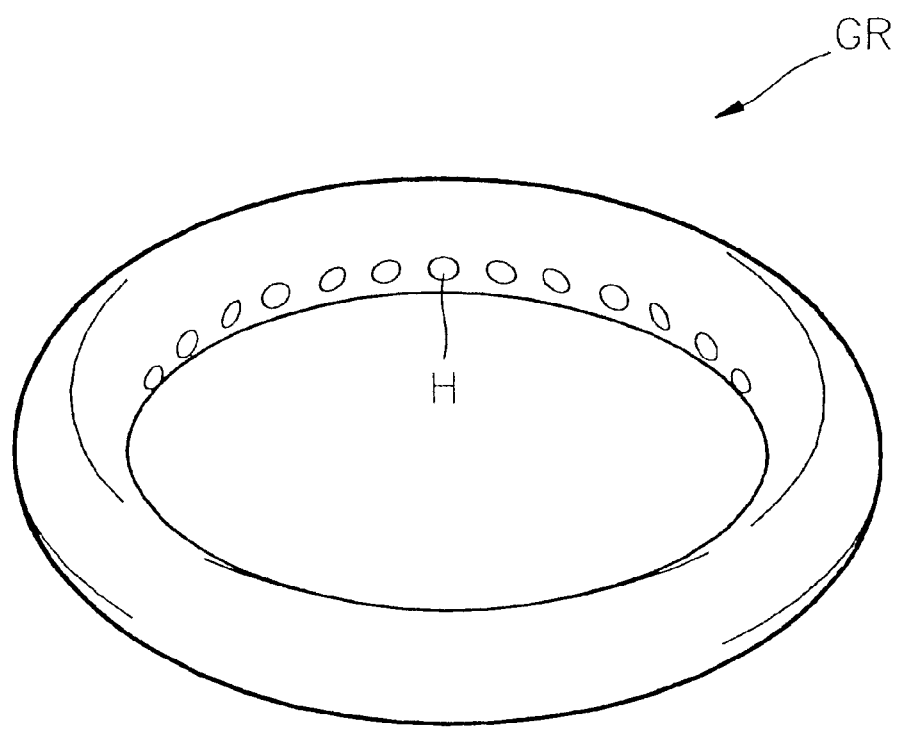
FIG. 2 is a perspective view of one embodiment of the gas injection ring of FIG. 1.

A grid plate GP is disposed beneath the cathode plate CP, and a gas injection ring GR is disposed below the grid plate GP. The gas injection ring GR has a doughnut shape as shown in FIG. 2. As shown in FIG. 2, the gas injection ring GR has a plurality of holes H along the inner circumference thereof, which allow a process gas, for example, an inert gas, to spray downwards and toward the center of the gas injection ring GR. In one embodiment, the grid plate GP is installed such that it is electrically insulated from the cathode plate CP and the chamber CB.

The cathode plate CP is connected to a high voltage power source HVP while the grid plate GP is connected to a low voltage power source LVP. In particular, the positive terminal of the high voltage power source HVP is grounded and the negative terminal thereof is connected to the cathode plate CP. Thus, a high negative voltage, for example, a voltage of −500 to −30,000 volts, is applied to the cathode plate CP. Similarly, the positive terminal of the low voltage power source LVP is grounded while the negative terminal thereof is connected to the grid plate GP. Accordingly, a negative low voltage, for example, a voltage of 0 to −500 volts, is applied to the grid plate GP.

A susceptor S is disposed on the bottom of the chamber CB, and a predetermined region of the bottom of the chamber CB is openeded to be connected to a vacuum pump P through a valve V interposed between the chamber CB and the vacuum pump P. The vacuum pump P maintains the pressure of the chamber CB at a lower pressure than the atmospheric pressure.

In operation of the electron beam irradiating apparatus having the above structure, a wafer, on which a material layer such as a photoresist layer or an SOG layer has been deposited, is loaded onto the susceptor S. The inner pressure of the chamber CB is maintained at a predetermined pressure, for example, a low pressure of 1 to 200 mTorr, by the vacuum pump P and the valve V. Subsequently, a process gas, for example, an argon (Ar) or nitrogen ($N_2$) gas, is injected into the chamber CB through the gas injection ring GR. At this time, a high negative voltage of about −500 to −30,000 volts is applied to the cathode plate CP by the high voltage power source HVP, while a low negative voltage of about 0 to −150 volts is applied to the grid plate CP by the low voltage power source LVP. Accordingly, the process gas injected into the chamber CB is ionized, so that positive and negative ions are produced, wherein the positive ions move toward the grid plate GP due to the electric field created by the low negative voltage applied to the grid plate GP. The positive ions that reach the grid plate GP are accelerated toward the cathode plate CP through the holes of the grid plate GP by the high negative voltage applied to the cathode plate CP. The accelerated positive ions hit the bottom surface of the cathode plate CP. As a consequence, secondary electrons are emitted from the cathode plate CP. Since the bottom surface of the cathode plate CP is formed of a non-metal conductive material, unlike a conventional case, emission of metal atoms from the cathode plate CP does not occur.

The electrons emitted from the cathode plate CP are accelerated toward the wafer loaded onto the susceptor S by the electric field produced by the high and low negative voltages applied to the cathode plate CP and the grid plate GP, respectively. At this time, some electrons further ionize the process gas molecules which are present between the grid plate GP and the wafer, to thereby produce positive and negative ions. This allows continuous emission of the electrons from the cathode plate CP.

With variations of the level of voltage applied to the grid and cathode plates, the number of electrons and the level of energy irradiated onto the wafer change. Thus, the wafer surface may be irradiated with an electron beam having a desired current density and energy by appropriate control of the grid voltage and cathode voltage.

In the case where a photoresist layer is irradiated with the electron beam, the photoresist layer is cured by baking. When an SOG layer is irradiated with the electron beam, the SOG layer is also cured, wherein the cured SOG layer exhibits similar properties to those of a silicon oxide layer. For example, the dielectric constant and etch rate of the resulting cured SOG layer are similar to those of the silicon oxide layer.

Also, by appropriately controlling an energy level of the electron beam irradiated onto the SOG layer, the thickness of the resulting cured SOG layer can be adjusted. For example, by appropriately controlling the electron beam irradiation conditions, a double-layered material film may be obtained. Each layer of the double-layered material film can be individually controlled and have different properties. For example, the double-layered film can include a non-cured SOG layer and a cured SOG layer.

Since the electron beam irradiation is carried out at a low temperature of 200° C. or less, diffusion of impurities that are implanted into the semiconductor wafer does not occur. Accordingly, a change in electrical properties of MOS transistors can be avoided. Also, when the wafer surface is irradiated with an electron beam by using the electron beam irradiating apparatus according to the present invention, the wafer can be prevented from contamination by metals, thus markedly improving the reliability of semiconductor devices. Thus, the electron beam irradiating apparatus according to the present invention is suitable for manufacturing highly integrated semiconductor devices with an increased requirement for low-temperature processing.

FIGS. 3 through 6 are schematic sectional views illustrating a method of forming inter-metal dielectric (IMD) films of semiconductor devices by using the electron beam irradiating apparatus according to the present invention. For reference, the electron beam irradiating apparatus according to the present invention can be applied to forming general ILD films and baking photoresist layers, as well as to forming IMD films. By irradiating the wafer surface with an electron beam using the electron beam irradiating apparatus according to the present invention, the wafer surface can be protected from contamination by metal atoms. In addition, the electron beam irradiating apparatus according to the present invention permits low-temperature processes at a temperature of 200° C. or less.

Figure 3:
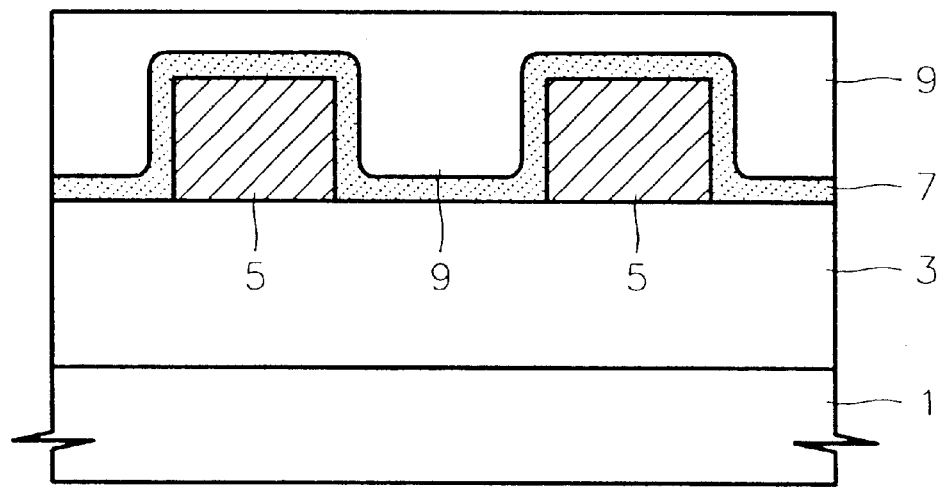
FIGS. 3 through 6 are schematic sectional views illustrating semiconductor device fabrication using the electron beam irradiating apparatus according to the present invention.

In particular, referring to FIG. 3, an ILD film 3 is formed on a semiconductor substrate 1. Lower metal interconnections 5 are formed in predetermined regions of the ILD film 3. Then, a first capping insulation layer 7, for example, a plasma oxide layer, is formed on the metal interconnections 5 and the ILD films between the metal interconnections 5. A planarized SOG layer 9 is formed on the entire surface of the resultant structure having the first capping insulation layer 7. The planarized SOG layer 9 is formed by spinning a layer of liquid SOG on the first capping insulation layer 7. The planarized SOG layer 9 completely fills spaces between adjacent lower metal interconnections 5 and is in the form of a thin film on the top of each lower metal interconnection 5.

Figure 4:
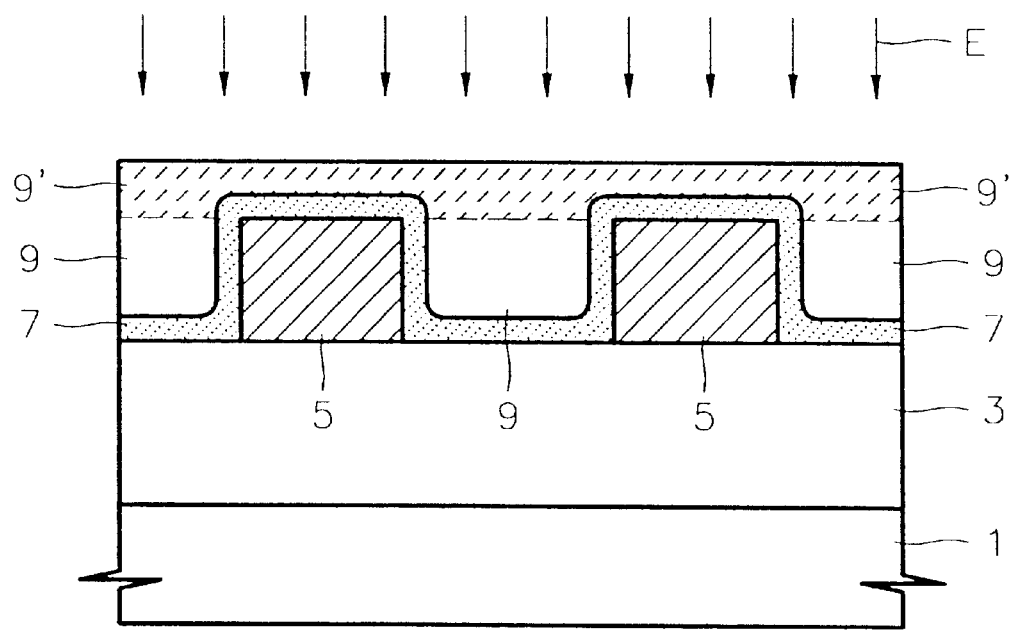

Referring to FIG. 4, the surface of the planarized SOG layer 9 is irradiated with an electron beam E by using the electron beam irradiating apparatus of FIG. 1. At this time, the energy level is appropriately controlled to the extent that the thin SOG layer 9 on the top of the lower metal interconnections 5 is cured while the SOG layer 9 filling the spaces between the lower metal interconnections 5 is not cured. As a result, a cured SOG layer 9' is formed to a predetermined thickness on the surface of the planarized SOG layer 9. The properties of the SOG layer 9 vary with a curing process. Thus, the cured SOG layer 9' exhibits similar properties to those of silicon oxide layers. In particular, the initial SOG layer 9, which is not cured yet, has a low dielectric constant and a high etch rate, compared to those of the silicon oxide layers. Meanwhile, the dielectric constant and the etch rate of the cured SOG layer 9' are nearly the same as those of the silicon oxide layers. In other words, it can be noted that as the SOG layer 9 is cured, the dielectric constant increases while the etch rate decreases.

Figure 5:
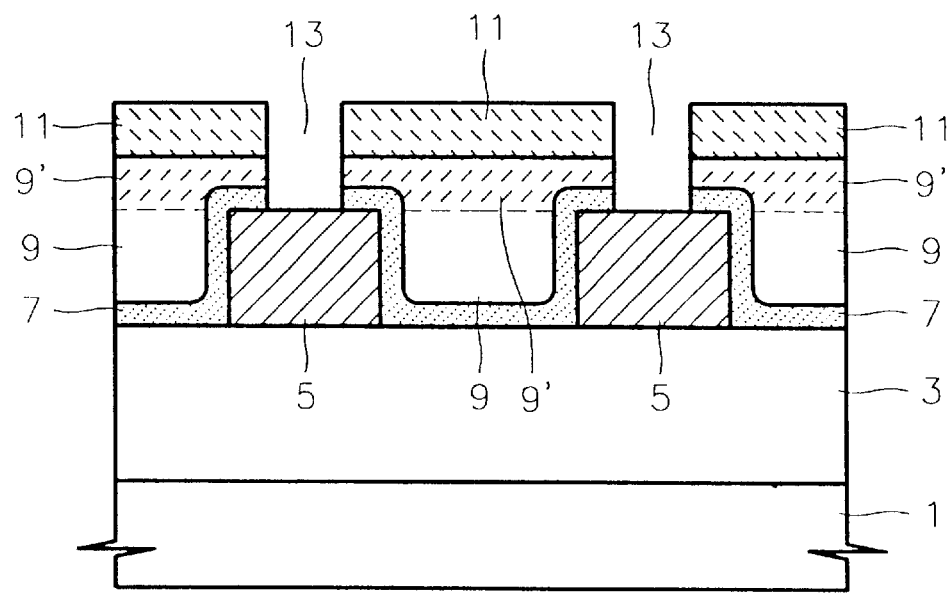

Referring to FIG. 5, a second capping insulation layer 11, for example, a plasma oxide layer, is formed on the cured SOG layer 9'. The second capping insulation layer 11, the cured SOG layer 9' and the first capping insulation layer 7 are sequentially etched, to thereby form via holes 13 which expose a predetermined region of the lower metal interconnections 5. The etch rate of the cured SOG layer 9' is nearly the same as that of the first and second capping insulation layers 7 and 11 formed of silicon oxide, such as plasma oxide, so that the vias 13 exhibit a normal sidewall profile. Also, since the uncured SOG layer 9 remains between the lower metal interconnections 5, parasitic capacitance between the lower metal interconnections 5 can be minimized.

Figure 6:
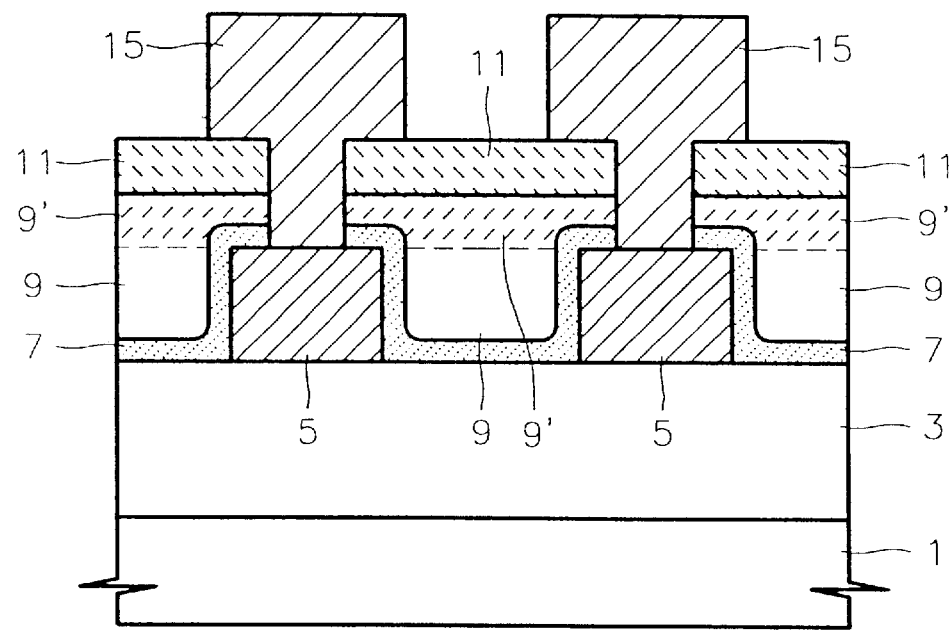

Referring to FIG. 6, a metal layer is deposited on the resultant structure having the vias 13, filling the vias 13. Then, the metal layer is patterned to form upper metal interconnections 15 which fill the vias 13.

As described above, the electron beam irradiating apparatus according to the present invention can effectively suppress emission of metal atoms from the cathode plate. Thus, during electron beam irradiation onto the SOG layer or the photoresist layer, the semiconductor wafer can be protected from contamination by the metal atoms, thus producing semiconductor devices with stabilized electrical properties and reliability.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An electron beam irradiating apparatus for treating a layer formed on a wafer, said apparatus comprising:
    a chamber having an opening at a top side of the chamber;
    a cathode plate disposed to cover the opening of the chamber, at least the bottom surface of the cathode plate, which faces an inner bottom surface of the inside of the chamber, being formed of a non-metal conductive material;
    a susceptor on which the wafer can be loaded disposed on the inner bottom surface of the chamber; and
    a grid plate disposed between the cathode plate and the susceptor, wherein, upon application of a potential difference across the cathode plate and the grid plate, a beam of electrons released from the bottom surface of the cathode plate impinges on the layer formed on the wafer to treat the layer formed on the wafer.

2. The electron beam irradiating apparatus of claim 1, wherein the cathode plate and the chamber are electrically insulated from each other.

3. The electron beam irradiating apparatus of claim 1, wherein the grid plate is electrically insulated from the chamber and the cathode plate.

4. The electron beam irradiating apparatus of claim 1, wherein the non-metal conductive material is silicon.

5. The electron beam irradiating apparatus of claim 1, wherein the cathode plate comprises an upper cathode plate formed of a metal and a lower cathode plate formed of the non-metal conductive material.

6. The electron beam irradiating apparatus of claim 1, wherein the cathode plate is a single cathode plate formed of the non-metal conductive material alone.

7. The electron beam irradiating apparatus of claim 1, further comprising a vacuum pump coupled to the chamber for altering the pressure in the chamber.

8. The electron beam irradiating apparatus of claim 1, further comprising a gas injection ring for allowing gas to enter the chamber.

9. The electron beam irradiating apparatus of claim 8, wherein the gas injection ring is disposed between the grid plate and the susceptor.

10. The electron beam irradiating apparatus of claim 1, wherein the layer is a spin-on-glass (SOG) layer.

11. The electron beam irradiating apparatus of claim 10, wherein the beam of electrons is used to at least partially cure the SOG layer.

12. The electron beam irradiating apparatus of claim 1, wherein the layer is a photoresist layer.

* * * * *